United States Patent
Park et al.

(10) Patent No.: US 7,940,564 B2
(45) Date of Patent: May 10, 2011

(54) THREE-DIMENSIONAL MEMORY DEVICE WITH MULTI-PLANE ARCHITECTURE

(75) Inventors: Ki-Tae Park, Seongnam-si (KR); Yeong-Taek Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 180 days.

(21) Appl. No.: 12/343,636

(22) Filed: Dec. 24, 2008

(65) Prior Publication Data

US 2009/0168534 A1    Jul. 2, 2009

(30) Foreign Application Priority Data

Jan. 2, 2008    (KR) .................. 10-2008-0000206

(51) Int. Cl.
*G11C 16/06*    (2006.01)
*G11C 5/02*    (2006.01)
*G11C 7/00*    (2006.01)
*G11C 8/00*    (2006.01)

(52) U.S. Cl. ......... 365/185.05; 365/185.17; 365/185.25; 365/51; 365/218; 365/230.03

(58) Field of Classification Search .................. None
See application file for complete search history.

(56) References Cited

U.S. PATENT DOCUMENTS

| | | | |
|---|---|---|---|
| 5,835,396 A | 11/1998 | Zhang | |
| 6,034,882 A | 3/2000 | Johnson et al. | |
| 7,002,825 B2 | 2/2006 | Scheuerlein | |
| 7,082,069 B2 * | 7/2006 | Chou et al. | 365/203 |
| 7,177,191 B2 | 2/2007 | Fasoli et al. | |
| 7,280,397 B2 * | 10/2007 | Scheuerlein | 365/185.08 |
| 7,606,080 B2 * | 10/2009 | Lee | 365/185.29 |
| 7,623,381 B2 * | 11/2009 | Park | 365/185.11 |
| 2003/0001230 A1 | 1/2003 | Lowrey | |
| 2007/0153620 A1 * | 7/2007 | Kang | 365/230.06 |
| 2008/0247240 A1 * | 10/2008 | Lee | 365/185.22 |

FOREIGN PATENT DOCUMENTS

| | | |
|---|---|---|
| JP | 2005209271 A | 8/2005 |
| KR | 1020070071610 A | 7/2007 |

* cited by examiner

*Primary Examiner* — Hoai V Ho
*Assistant Examiner* — James G Norman
(74) *Attorney, Agent, or Firm* — Volentine & Whitt, PLLC (57) ABSTRACT

Disclosed is a 3D memory device including a first plane having a first mat formed on a first layer and a third mat formed on a second layer disposed over the first layer, the first and third mats sharing a bit line, and a second plane having a second mat formed on the first layer and a fourth mat formed on the second layer. The second and fourth mats share a bit line. Each one of the first through fourth mats includes a plurality of blocks and a block associated with the first plane is simultaneously accessed with a block of the second plane.

16 Claims, 14 Drawing Sheets

THREE-DIMENSIONAL MEMORY DEVICE WITH MULTI-PLANE ARCHITECTURE

CROSS-REFERENCE TO RELATED APPLICATIONS

This U.S. non-provisional patent application claims priority under 35 U.S.C. §119 to Korean Patent Application No. 10-2008-0000206 filed on Jan. 2, 2008, the subject matter of which is hereby incorporated by reference.

BACKGROUND

The present invention relates generally to three-dimensional (3D) memory devices and more particularly, to a 3D memory device having a multi-plane architecture.

The development of semiconductor memory devices is one characterized in part by continuous improvement in memory cell density (i.e., the number of memory cells provided per unit surface area). One approach to the fabrication of memory cells with higher memory cell integration density uses a vertically stacked arrangement of multiple substrate layers. The term "vertical" in this context is merely an orientation reference commonly drawn in relation to the principal planar surface of a base substrate. The result stack of memory devices or stack of substrates incorporating memory cell arrays may be termed a three-dimensional array structure, or 3-dimensional memory device.

Examples of conventional 3-dimensional memory devices may be found in U.S. Pat. No. 5,835,396 Nov. 10, 1998 and entitled "THREE-DIMENSIONAL READ-ONLY MEMORY", U.S. Pat. No. 6,034,882 issued Mar. 7, 2000 and entitled, "VERTICALLY STACKED FIELD PROGRAMMABLE NONVOLATILE MEMORY AND METHOD OF FABRICATION", and U.S. Pat. No. 7,002,825 issued Feb. 21, 2006 and entitled, "WORD LINE ARRANGEMENT HAVING SEGMENTED WORD LINES". The collective subject matter of these documents is hereby incorporated by reference.

As described in the foregoing reference documents, 3-dimensional memory devices typically include memory cell arrays formed in each layer of a vertical stacked plurality of semiconductor material layers. Most commonly, such semiconductor material layers are formed from silicon substrates using conventionally understood fabrication techniques. In certain examples, stacked layers may be formed using epitaxial growth processes.

However, since conventional 3D memory devices use a composite (or amalgamated) memory array implemented by a plurality of individual memory arrays arranged in a multi-plane structure, defined blocks of data (i.e., memory blocks) are distributed across a plurality of individual memory arrays disposed at different planes within the device. As a result, a single read, write, or erase operation directed to a particular memory block must be conducted in relation to different memory arrays in multiple planes.

SUMMARY

Embodiments of the invention provide 3D memory devices having a multi-plane architecture, yet also providing enhanced flexibility in managing memory blocks. Embodiments of the invention provide an erase method well adapted for use in a 3D memory device having a multi-plane architecture which is characterized by reduced power consumption.

In one embodiment, the invention provides a 3D memory device comprising; a first plane including a first mat formed on a first layer and a third mat formed on a second layer disposed over the first layer, the first and third mats sharing a bit line, and a second plane including a second mat formed on the first layer and a fourth mat formed on the second layer, the second and fourth mats sharing a bit line, wherein each one of the first through fourth mats comprises a plurality of blocks, wherein a block associated with the first plane is simultaneously accessed with a block of the second plane.

In another embodiment, the invention provides a 3D memory device comprising; a bit line, first and second NAND strings connected to the bit line, and a page buffer configured to perform an erase-verification operation in relation to the first NAND string by determining whether the bit line is charged following an erase operation applied to the first NAND string, and further configured to perform the erase-verification operation in relation to the second NAND string by determining whether the bit line is discharged following an erase operation applied to the second NAND string.

In another embodiment, the invention provides a multi-plane operation method for a 3D memory device, comprising; inputting an operation command, inputting an address of a first plane, inputting an address of a second plane, and conducting a multi-plane operation in response to the operation command, wherein the addresses of the first and second planes are different from each other in block address.

DESCRIPTION OF EMBODIMENTS

Preferred embodiments of the present invention will now be described in some additional detail with reference to the accompanying drawings. The present invention may, however, be embodied in different forms and should not be construed as being limited to only the illustrated embodiments. Rather, the embodiments are presented as teaching examples. Throughout the written description and drawings, like reference numerals refer to like or similar elements.

In a 3D multi-plane memory device according to the present invention, addresses are independently allocated to memory blocks respective to planes. It therefore increases the flexibility of block management. Additionally, a 3D multi-plane memory device according to the present invention is advantageous to reducing power consumption by conducting erase verification with charging and discharging a shared bit line.

Figure 1:
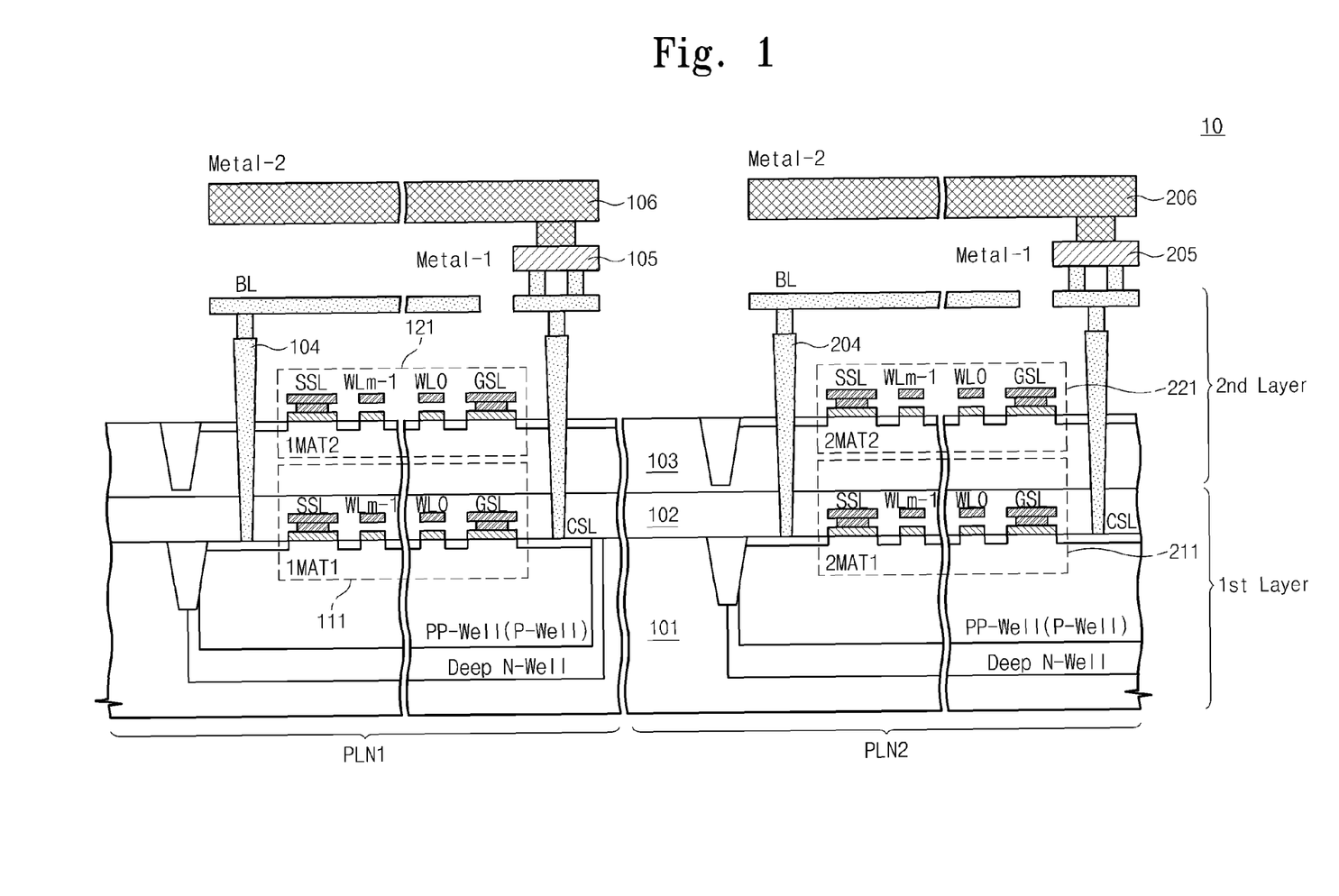
FIG. 1 is a sectional diagram of a 3D memory device with multi-plane architecture according to an embodiment of the invention.

Figure (FIG.) 1 is a sectional diagram of a 3D memory device 10 having multi-plane architecture according to an embodiment of the invention. The example illustrated in FIG. 1 is assumed to be a NAND flash memory device, but other types of memory devices, both volatile and nonvolatile in their operation, are susceptible to the benefits provided by the present invention. For example, other embodiments of the invention are applicable to NOR flash memory devices, read-only memory devices (ROM), static random access memory devices (SRAM), and silicon-oxide-nitride-oxide-silicon (SONOS) memory devices.

Referring to FIG. 1, the 3D memory device 10 comprises two planes PLN1 and PLN2 that are arranged in the 3D memory array 10. Only two (2) planes are illustrated in the example, but those skilled in the art will understand that more planes may be used to implement the 3D memory device 10. The first plane PLN1 includes a first mat 111 where a first memory array is formed in a first material layer, and a second mat 121 where a second memory array is formed in a second material layer. Each of the mats 111 and 121 may include memory cells storing one or more memory blocks. For ease of reference, a collection of memory cells and related circuitry adapted to read, write (or program), or erase a defined block of data will be referred to as a "memory block". Memory blocks may be variously defined according to the hardware resources available in a particular memory device and/or control software definitions. In the illustrated embodiment of FIG. 1, each memory block may include multiple strings of NAND memory cells and associated control circuitry, but only a single string will be described for clarity. Further, the strings disposed in the first and second mats 111 and 121 are assumed to share a bit line 104, but other bitline arrangements are possible.

The second plane PLN2 includes a third mat 211 where a memory array is formed in the first layer and a fourth mat 221 where a memory array is formed in the second layer. Mats 211 and 221 are similarly configured as mats 111 and 121.

In the illustrated embodiment of a 3D memory device shown in FIG. 1, it is further assumed that respective memory blocks (or pages of memory) are associated with the first plane PLN1 and the second plane PLN2. Thus, the first and third mats 111 and 211 in the first layer are formed in a first substrate 101 formed from (e.g.,) bulk silicon or similar material. The second and fourth mats 121 and 221 in the second layer are formed in a second substrate 103 formed from (e.g.,) a single crystal substrate or similar material conventionally used to implement a silicon-on-insulator (SOI) structure. Hence, the first and second layers are insulated from each other by a dielectric layer 102. Dielectric layer 102 may be formed from borosilicate glass (BSG), phosposilicate glass (PSG), or borophosphosilicate glass (BPSG), etc.

Figure 2:
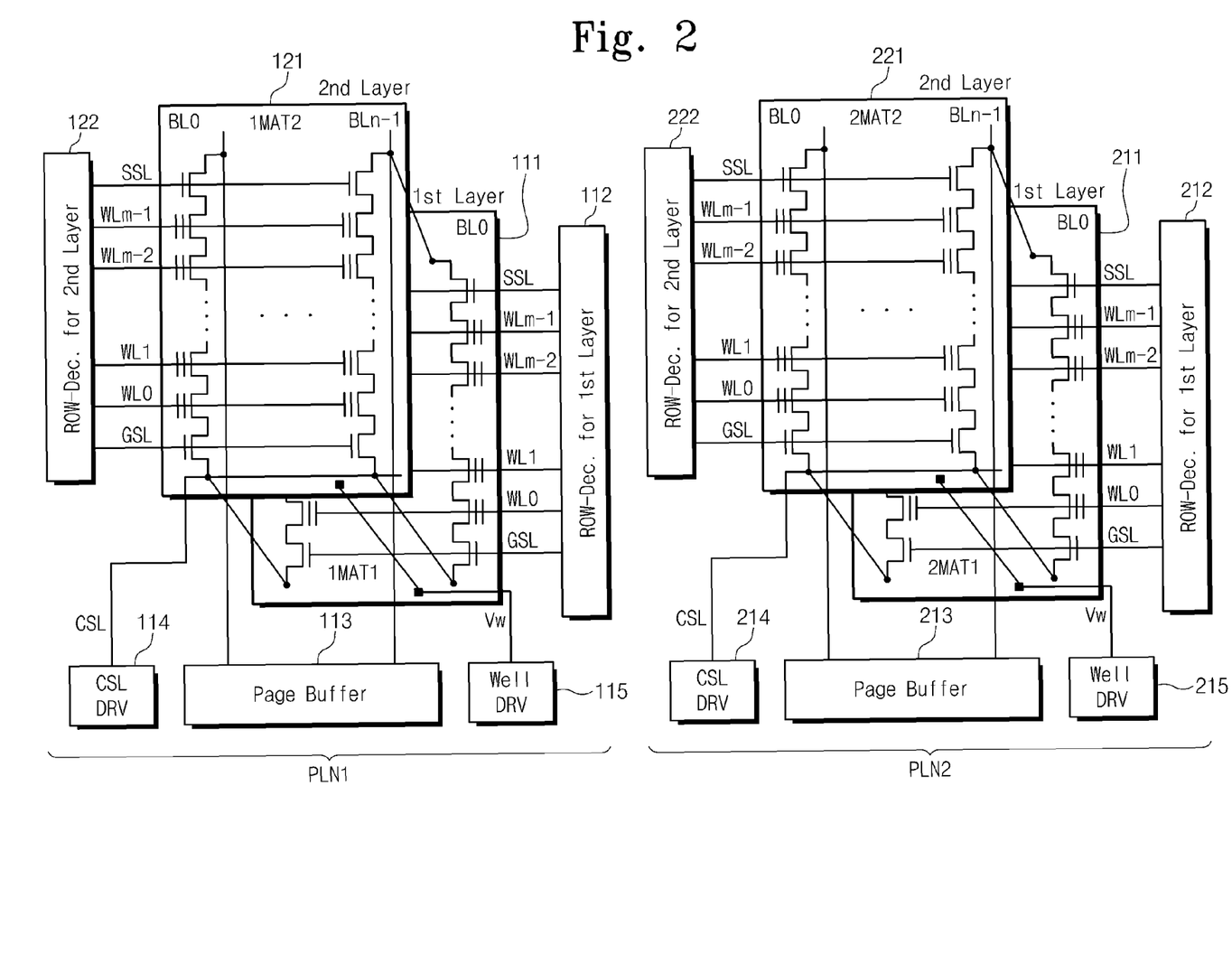
FIG. 2 is a circuit diagram of the 3D multi-plane memory device shown in FIG. 1.

FIG. 2 is a circuit diagram of the 3D multi-plane memory device shown in FIG. 1. Referring to FIG. 2, the first plane PLN1 comprises the first mat (1MAT1) 111 formed in the first layer, the second mat (1MAT2) 121 formed in the second layer, row decoders 112 and 122, a page buffer 113, a common source line (CSL) driver 114, and a well voltage driver 115. The first and second mats 111 and 121 respective to the first and second layers are arranged to share bit lines BL0 through BLn-1. The shared bit lines BL0 through BLn-1 are connected to a single page buffer 113. The first and second mats 111 and 121 of the first and second layers also share a common source line CSL. The common source line CSL is controlled by the CSL driver 114.

The first and second mats 111 and 121 of the first and second layers also share a well voltage Vw. The well voltage Vw is adjusted by the well voltage driver 115. In the first plane PLN1, blocks other than the mats 111 and 121 may be formed in various patterns over the first or second layer.

Referring to FIG. 2, the second plane PLN2 comprises the third mat (2MAT1) 211 formed in the first layer, the fourth mat (2MAT2) 221 formed in the second layer, row decoders 212 and 222, a page buffer 213, a common source line (CSL) driver 214, and a well voltage driver 215. The second plane PLN2 may be configured with the same structure as the first plane PLN1.

In FIG. 2, word lines are separately arranged one from another by layers, but may be otherwise divided in other embodiments of the invention. However, the word lines of the illustrated embodiments are shared by layer.

Figure 3:
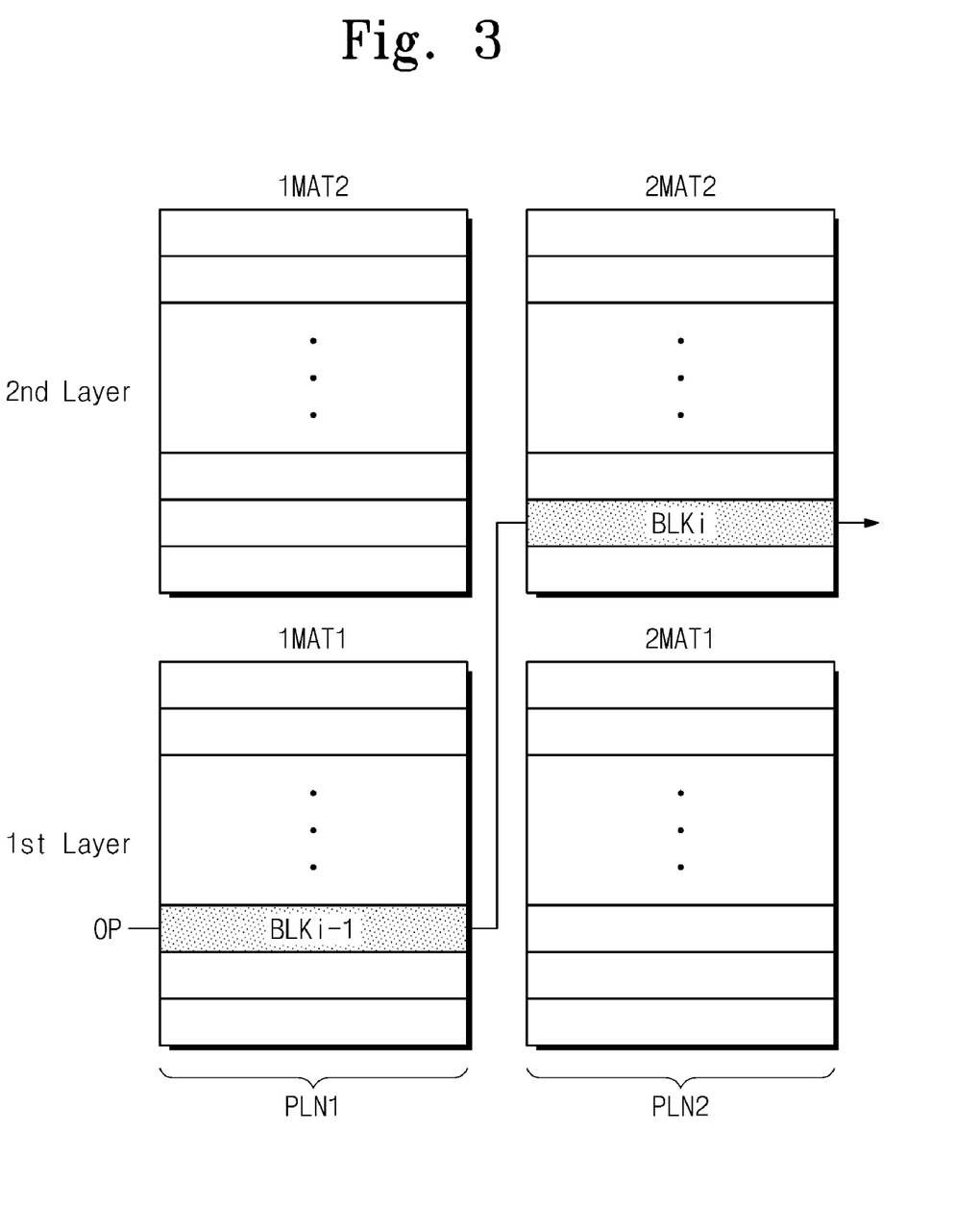
FIG. 3 is a schematic diagram illustrating an operation of the 3D multi-plane memory device according to an embodiment of the invention.

FIG. 3 is a schematic diagram illustrating the operation of the 3D multi-plane memory device 10 according to an embodiment of the invention. In the 3D multi-plane memory device 10, arbitrary blocks respective the first and second planes PLN1 and PLN2 are operable at the same time. For instance, as shown in FIG. 3, an operation (OP) directed to the 3D memory device 10 may be conducted in relation to a first arbitrary block BLKi-1 of the first plane PLN1 along with a second arbitrary block BLKi of the second plane PLN2.

This data access capability associated with the operation of the 3D multi-plane memory device 10 is helpful to increasing the flexibility of block management, since logically contiguous blocks need not be stored physically adjacent portions of adjacent planes within a multi-plane device. For example, it is assumed that the memory devices forming the fourth mat 211 (2MAT1) of the second plane PLN2 do not operate properly and have been previously designated as a bad block. Nonetheless, it is permissible for the 3D multi-plane memory device to select a "next" block associated with the second plane PLN2 in correspondence with a "previous" block associated with the first plane PLN1. The reverse is also possible.

According to the present invention, blocks belonging each to the first and second planes PLN1 and PLN2 may be accessed at the same time. This non-coplanar, yet coincident operation of the 3D memory device to access multiple blocks allows flexibly page definitions in relation to the blocks.

For the operation of the 3D multi-plane memory device 10, the blocks of the first and second planes PLN1 and PLN2 may be allocated with block addresses in various ways. Block address allocation may be carried out by an external memory controller (not shown). The memory controller functions to control an overall operation of the 3D memory device 10. The memory controller arranges an order of block addresses to the blocks of the layers in accordance with physical locations.

Besides this flexible approach to block address allocation, embodiments of the invention are also able to allocate page addresses in the 3D memory device 10 using a similar technique.

Figure 4:
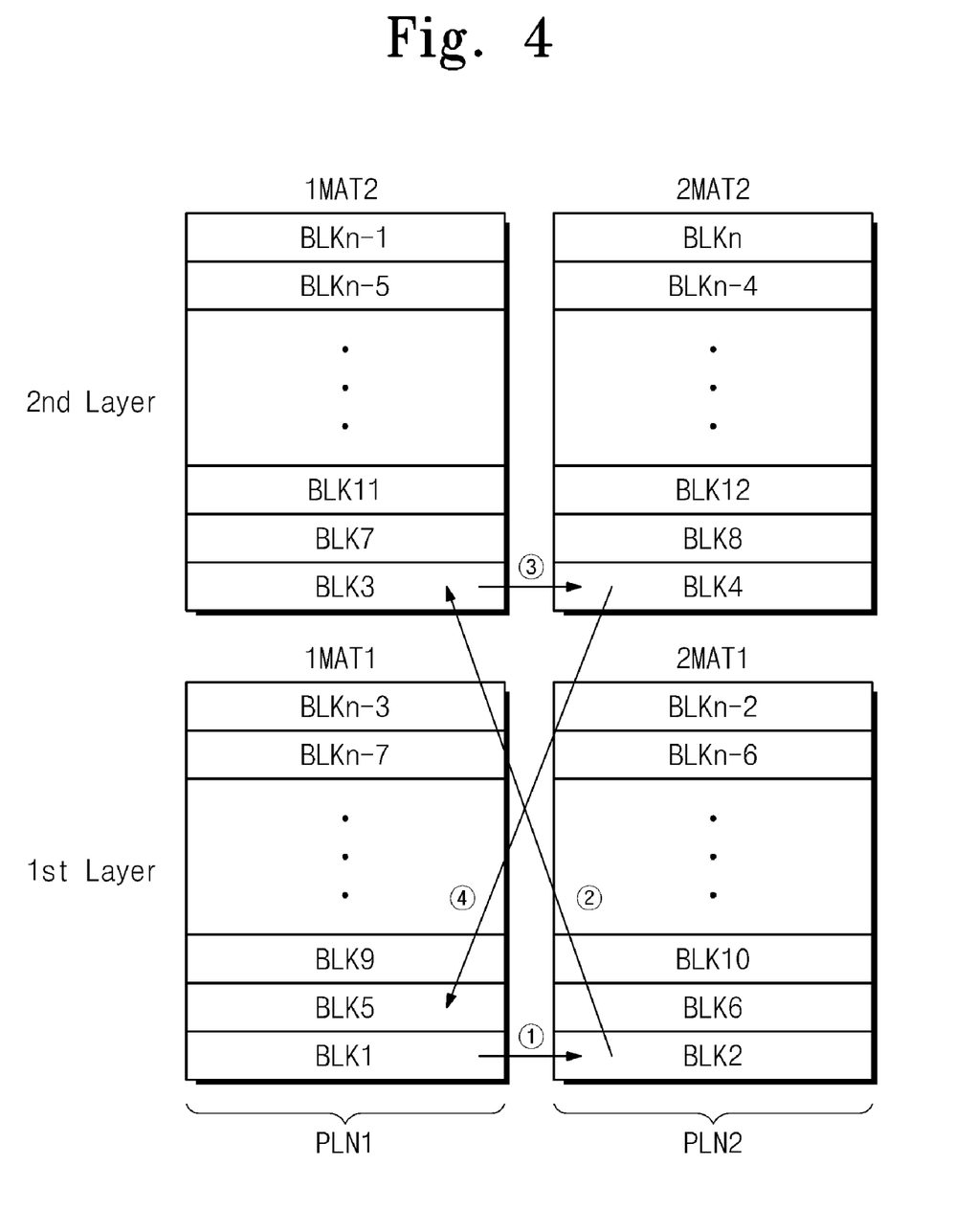
FIG. 4 shows a first embodiment of block address allocation in the 3D multi-plane memory device according to an embodiment of the invention.

FIG. 4 further illustrates one embodiment of the invention providing block address allocation in the 3D multi-plane memory device. Referring to FIG. 4, block addresses are allocated to logically sequential blocks in the sequence of "1"→"2"→"3"→"4". However, the block address allocation process despite being logically continuous is also spatially discontinuous within the 3D multi-plane memory device and non-coplanar within the sequence. That is, the block addresses are allocated to select a first block BLK1 in the first layer of the first plane PLN1, then select a second block BLK2 in the first layer of the second plane PLN2 ("1"), then select a third block BLK3 in the second layer of the first plane PLN1 ("2"), then select a fourth block BLK4 in the second layer of the second plane PLN2 ("3"), and then select a fifth block BLK5 in the first layer of the first plane PLN1 ("4").

Figure 5:
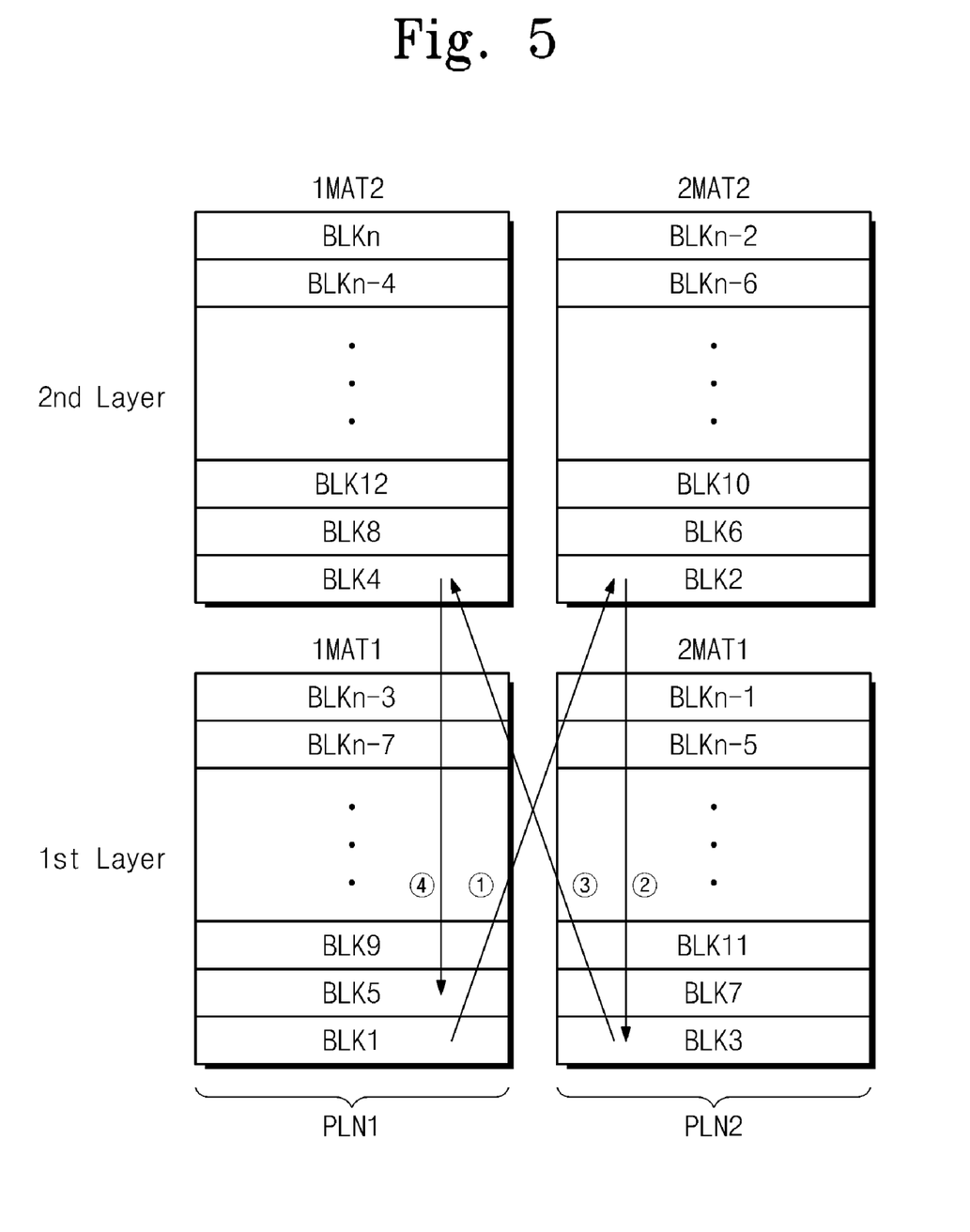
FIG. 5 shows a second embodiment of block address allocation in the 3D multi-plane memory device according to an embodiment of the invention.

In contrast, FIG. 5 further illustrates another embodiment of the invention providing block address allocation in the 3D multi-plane memory device. Referring to FIG. 5, block addresses are again continuously allocated in a sequence "1"→"2"→"3"→"4" according to logically continuous addresses but are spatially discontinuous within the 3D multi-plane memory device and non-coplanar. For instance, block addresses are allocated to select a first block BLK1 from the first layer of the first plane PLN1, then select a second block BLK2 from the second layer of the second plane PLN2 ("1"), then select a third block BLK3 from the first layer of the second plane PLN2 ("2"), then select a fourth block BLK4 from the second layer of the first plane PLN1 ("3"), and then select a fifth block BLK5 from the first layer of the first plane PLN1 ("4").

Figure 6:
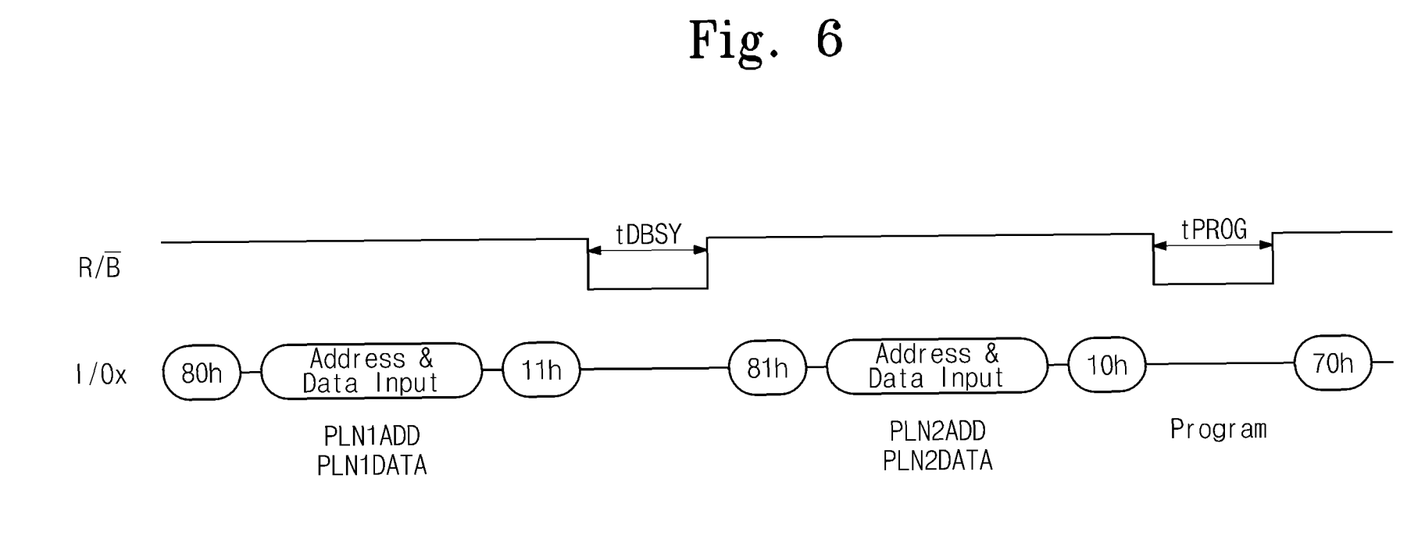
FIG. 6 is a timing diagram of a programming method in the 3D multi-plane memory device according to an embodiment of the invention.

FIG. 6 is a timing diagram related to a programming method for the 3D multi-plane memory device 10 according to an embodiment of the invention. Referring to FIGS. 2 and 6, a programming operation, for example, for the 3D memory device may be conducted as follows. After providing a serial data input command (e.g., '80h' of hexadecimal code) to the first plane PLN1, an address PLN1 ADD and page data PLN1 DATA for the first plane PLN1 are transferred thereto. After inputting page data into a page buffer of the first plane PLN1, a dummy page program command (e.g., '11h') for the first plane PLN1 is provided thereto.

After a predetermined time tDBSY, a serial data input command (e.g., '81h') for the second plane PLN2 is provided thereto. And, an address PLN2ADD and page data PLN2DATA for the second plane PLN2 are transferred thereto. After inputting page data into a page buffer of the second plane PLN2, a page program command (e.g., '10h') for the first plane PLN1 is provided thereto. In compliance with the page program command '10h', page data loaded in the page buffers 113 and 213 respective to the first and second planes PLN1 and PLN2 are coincidently programmed into their corresponding memory arrays for a predetermined time tPROG. After completing such a programming operation, a read command (e.g., '70h') is transferred to the 3D memory device so as to verify a result of the programming operation.

Here, the address PLN1ADD of the first plane PLN1 is different from the address PLN2ADD of the second plane PLN2. Especially, under the multi-plane operation, the first and second planes PLN1 and PLN2 are different from each other in block address. According to the illustrated embodiment of the invention, a page associated with an arbitrary block of the first plane PLN1 is simultaneously programmed (at least in part) with a page associated with an arbitrary block of the second plane PLN2. Since block addresses of the first and second planes PLN1 and PLN2 are different from each other in the multi-plane operation, those are independently allocated to the blocks of the first and second planes PLN1 and PLN2. However, the block addresses may not always be different from each other in the multi-plane operation.

Figure 7:
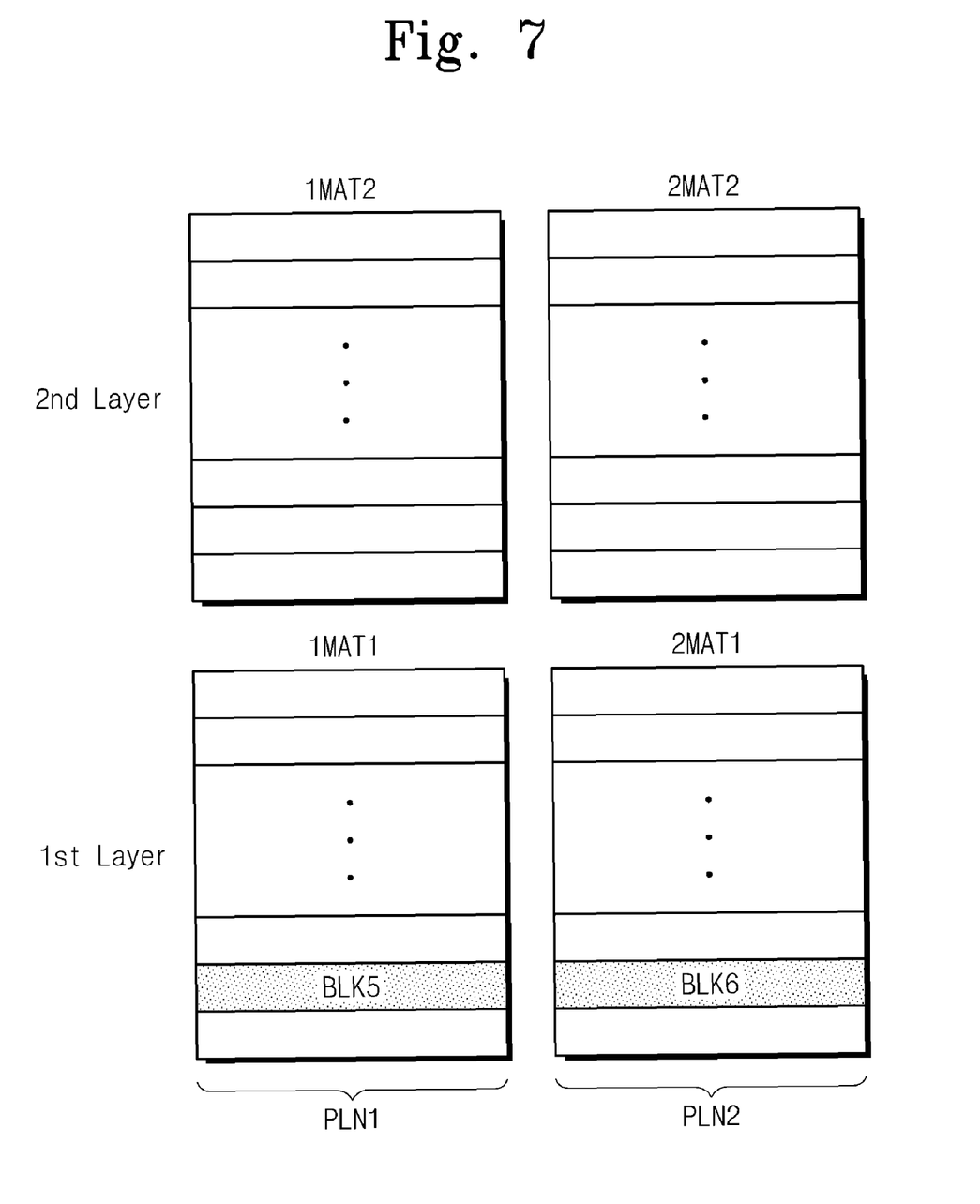
FIG. 7 shows a feature of programming method in the 3D multi-plane memory device to which the block addresses are allocated as shown in FIG. 4.

As illustrated in FIGS. 4 and 5, there are many ways for practicing a programming method for a 3D memory device in which block addresses may be allocated according to an embodiment of the invention. FIG. 7 shows a feature of the programming method for the 3D multi-plane memory device 10 to which the block addresses are allocated as shown in FIG. 4. Referring to FIG. 7, according to the programming method for the 3D memory device 10, pages respectively belonging to the blocks BLK5 and BLK6 adjacent to each other in each layer are programmed at the same time. That is, a page including at least the fifth block BLK5 of the first layer is simultaneously programmed together with a page including at least the sixth block BLK6 of the first layer. Also in a reading operation, the pages respective to the adjacent blocks (e.g., BLK5 and BLK6) of each layer will be simultaneously accessed. In this context, the term "simultaneous" means that the constituent operation accesses (reads/writes/erases) the different blocks at least in part in a temporally overlapping manner. Said operation need not begin or end at exactly the same moment(s), but will be substantially overlapping their temporal execution.

Figure 8:
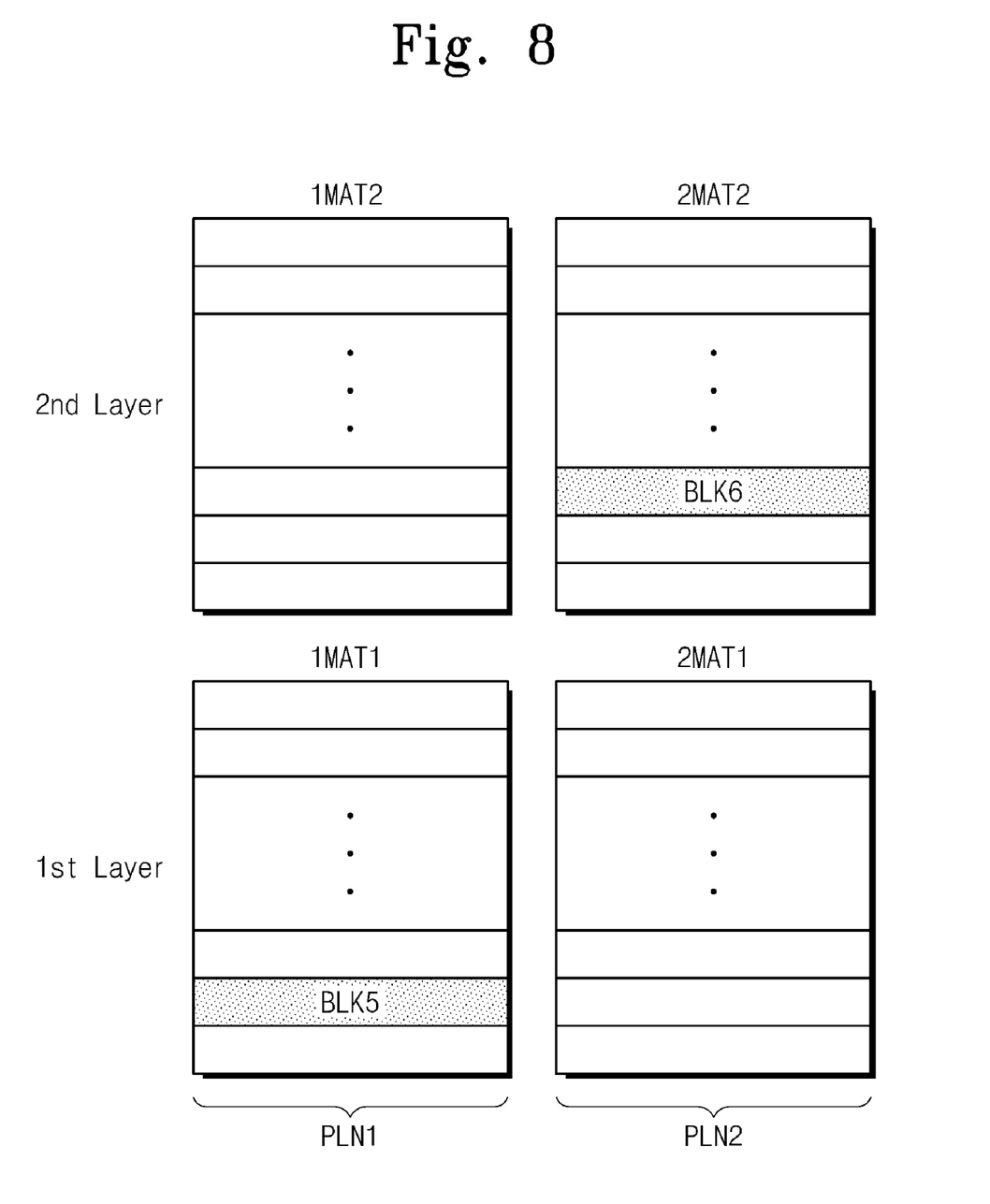
FIG. 8 shows a feature of programming method in the 3D multi-plane memory device to which the block addresses are allocated as shown in FIG. 5.

FIG. 8 shows another feature of programming method for the 3D multi-plane memory device 10 to which the block addresses are allocated as shown in FIG. 5. Referring to FIG. 8, this programming method is carried out by simultaneously programming at least a page of an arbitrary block (e.g., BLK5) associated with the first plane PLN1 of the first layer with at least a page of an arbitrary block (e.g., BLK6) associated with the second plane PLN2 of the second layer. That is, a page included in the fifth block BLK5 of the first layer is simultaneously programmed with a page include in the sixth block BLK6 of the second layer. Here, the pages respective to the fifth and sixth blocks BLK5 and BLK6 may be referred to as a defined or particularly designated single page. Also in during a read operation, pages associated with the blocks (e.g., BLK5 and BLK6) respective to the first and second layers will be accessed simultaneously.

Figure 9:
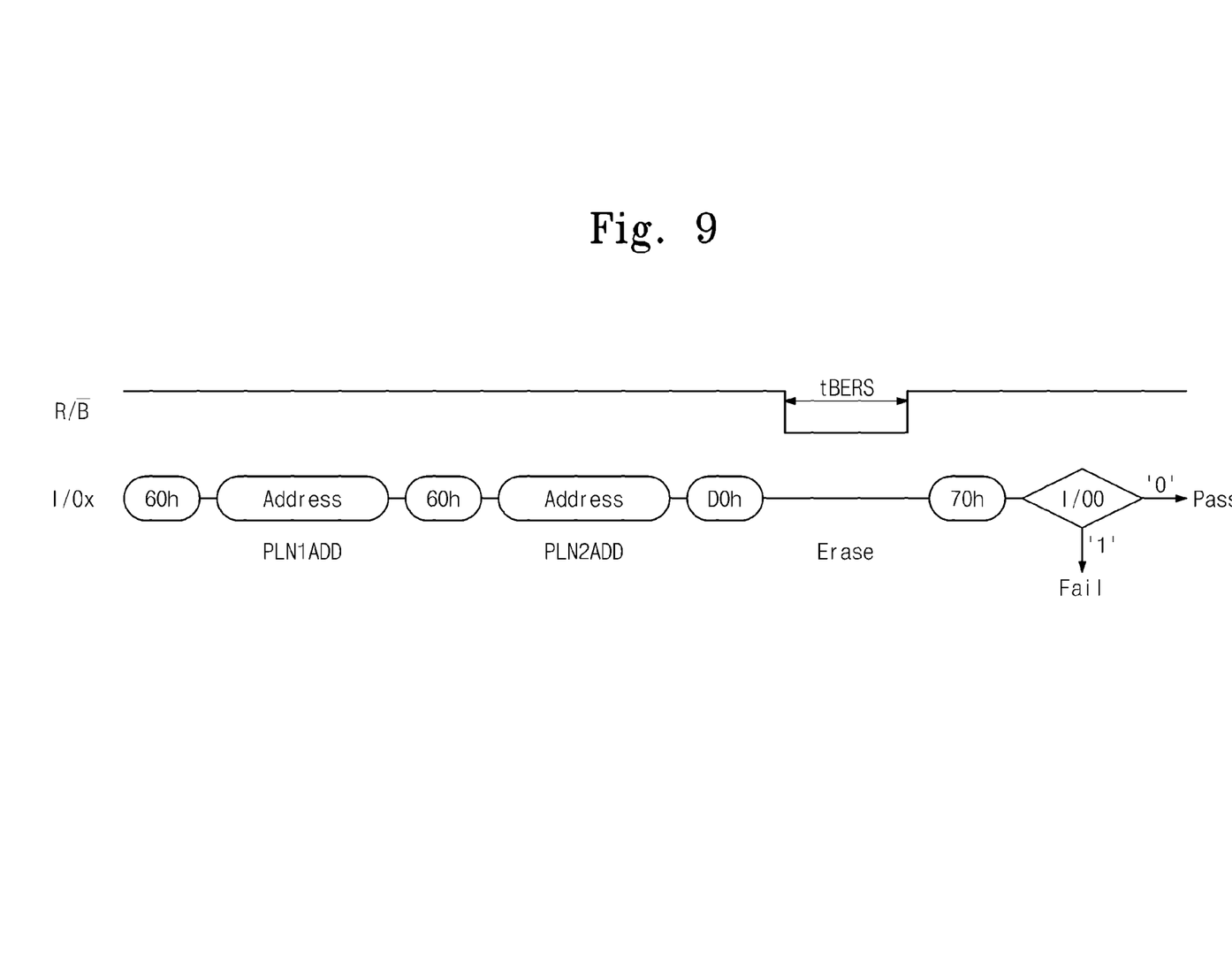
FIG. 9 is a timing diagram of an erase method in the 3D multi-plane memory device according to an embodiment of the invention.

FIG. 9 is a timing diagram related to an erase operation or erase method adapted for use in the 3D multi-plane memory device 10 according to an embodiment of the invention. Referring to FIGS. 2 and 9, the erase method may be carried out as follows. First, an erase setup command (e.g., '60h') for the first plane PLN1 is provided to the 3D memory device 10. Continuously, an address PLN1ADD of the first plane PLN1 is transferred thereto. Afterwards, an erase setup command '60h' and an address PLN2ADD for the second plane PLN2 are transferred thereto in sequence. Responding to an erase command (e.g., 'D0h'), blocks corresponding to the addresses PLN1ADD and PLN2ADD are simultaneously erased during a predetermined period of time (tBERS). After the erase operation is complete, a read command (e.g., '70h') is transferred to the 3D memory device 10 to verify results for the erase operation. Here, the address PLN1ADD of the first plane PLN1 is different from the address PLN2ADD of the second plane PLN2. In particular, block addresses are different in the addresses PLN1ADD and PLN2ADD.

While arbitrary blocks of the first and second planes PLN1 and PLN2 are simultaneously erased, their block addresses are different from each other. In other words, within the context of an erase operation applied to a multi-plane memory device, the first and second planes PLN1 and PLN2 are independently allocated with block addresses different from each other in the addresses PLN1 and PLN2.

Figure 10:
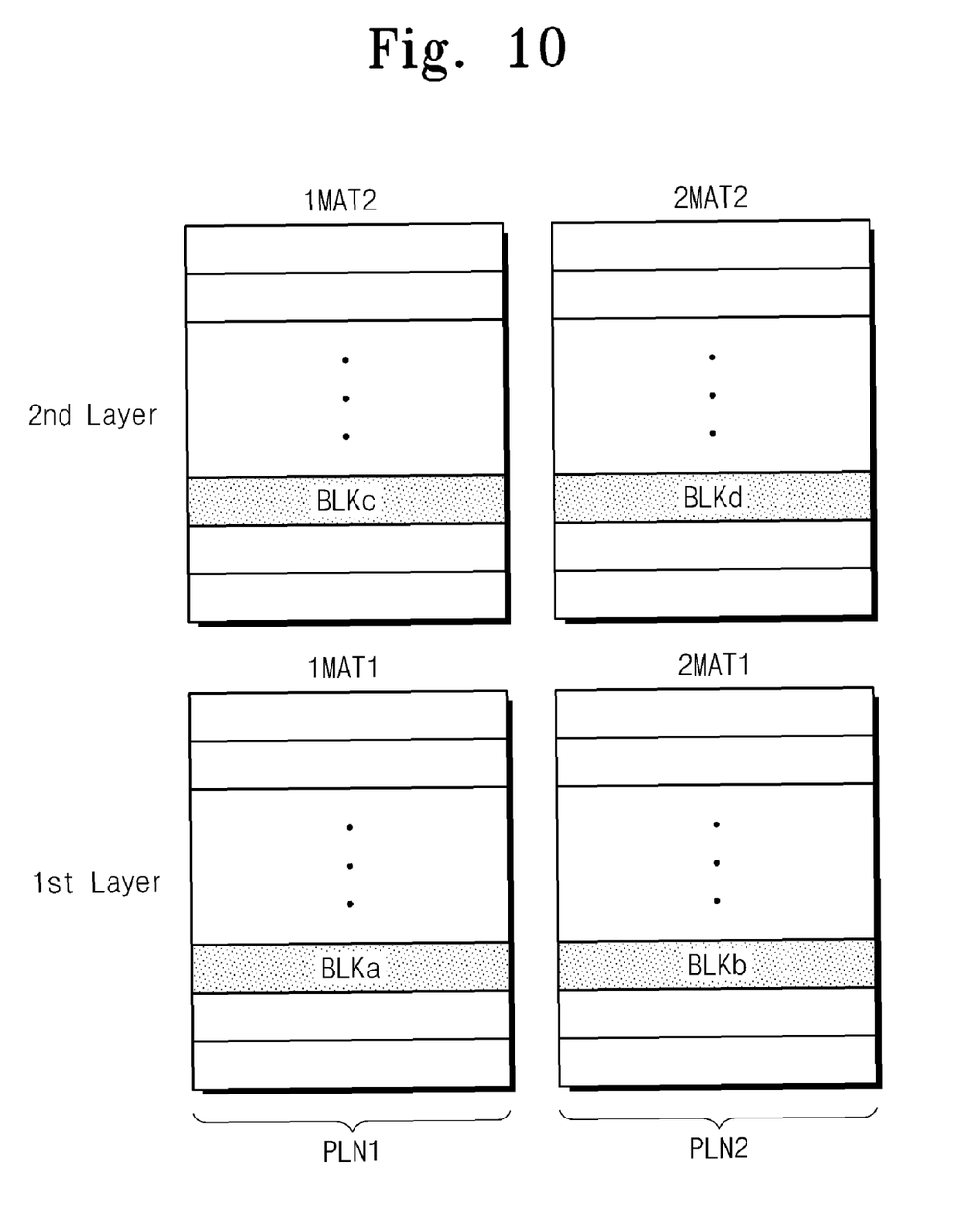
FIG. 10 shows a feature of block-erase method in the 3D multi-plane memory device to which the block addresses are allocated as shown in FIG. 4.

As shown in FIGS. 4 and 5, embodiments of the invention offer various features applicable to an erase method applied to a 3D memory device to which the block addresses are allocated. FIG. 10 further illustrates another feature associated with a block-erase method adapted for use in the 3D multi-plane memory device to which the block addresses are allocated as shown in FIG. 4. Referring to FIG. 10, a first block BLKa of the first plane is simultaneously erased together with a second block BLKb of the second plane PLN2 in the first layer, while a third block BLKc of the first plane is simultaneously erased together with a fourth block BLKd of the second plane PLN2 in the second layer. The multiple blocks BLKa through BLKd can be simultaneously erased. In other words, the 3D memory device is operable in multi-block erase mode.

Figure 11:
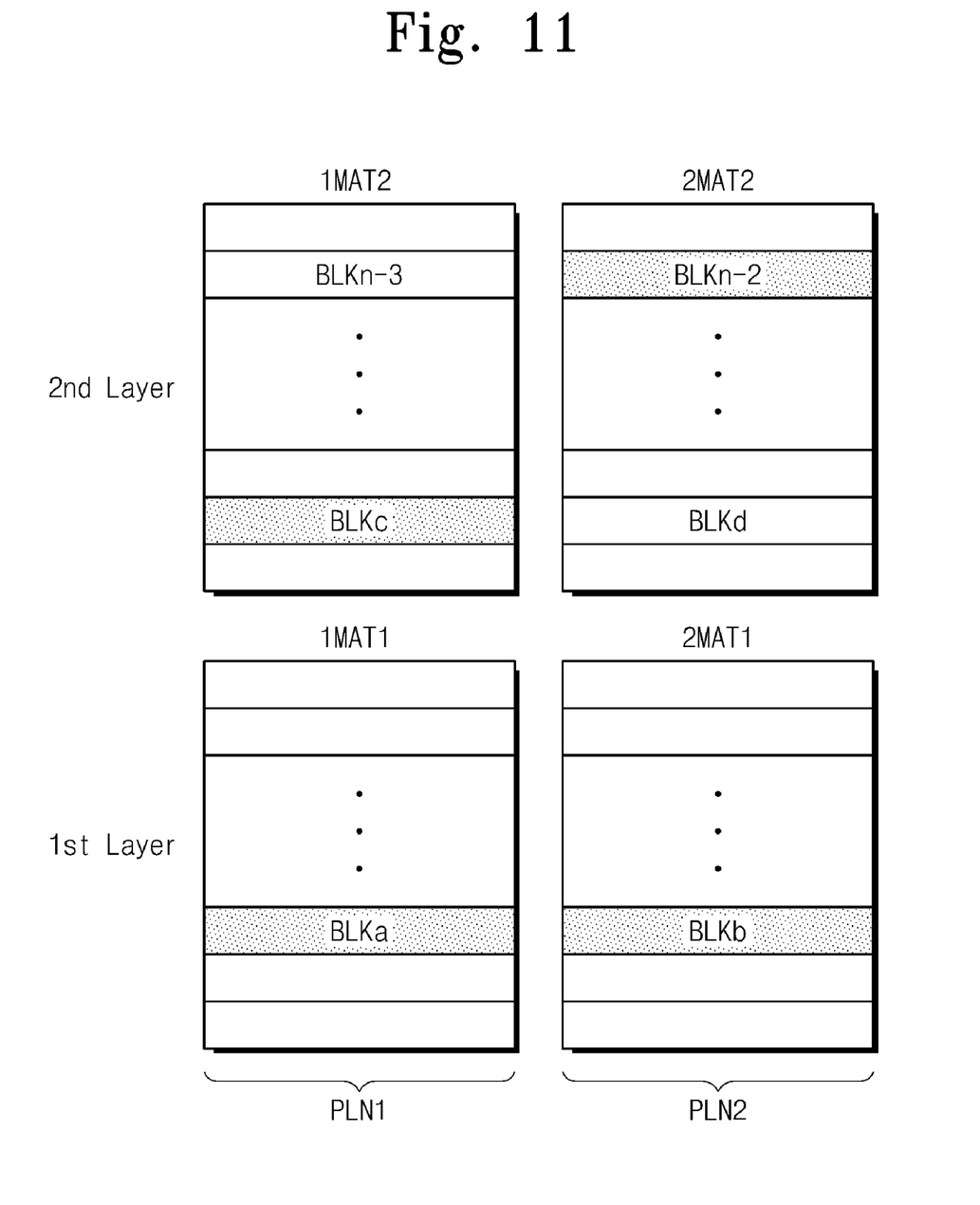
FIG. 11 shows a feature of block-erase method in the 3D multi-plane memory device to which the block addresses are allocated as shown in FIG. 5.

FIG. 11 further illustrates yet another feature associated with a block-erase method in the 3D multi-plane memory device 10 to which the block addresses are allocated as shown in FIG. 5. Referring to FIG. 11, arbitrary blocks, but the block BLKa of the first plane PLN1 and the block BLKb of the second plane PLN2, are simultaneously erased in the first layer, while arbitrary blocks, but the block BLKc of the first plane PLN1 and the block BLKd of the second plane PLN2, are simultaneously erased in the second layer. The arbitrary blocks but the blocks BLKa ~BLKd can be also simultaneously erased in the first and second layers.

The multi-plane operation method for the 3D memory device according to embodiments of the invention may be carried out by including the steps of inputting an operation command, inputting an address of the first plane, inputting an address of the second plane, and conducting the multi-plane operation in response to the operation command even where the addresses of the first and second planes have different block addresses. The input operation command may be a program, read, and/or erase command.

Figure 12A:
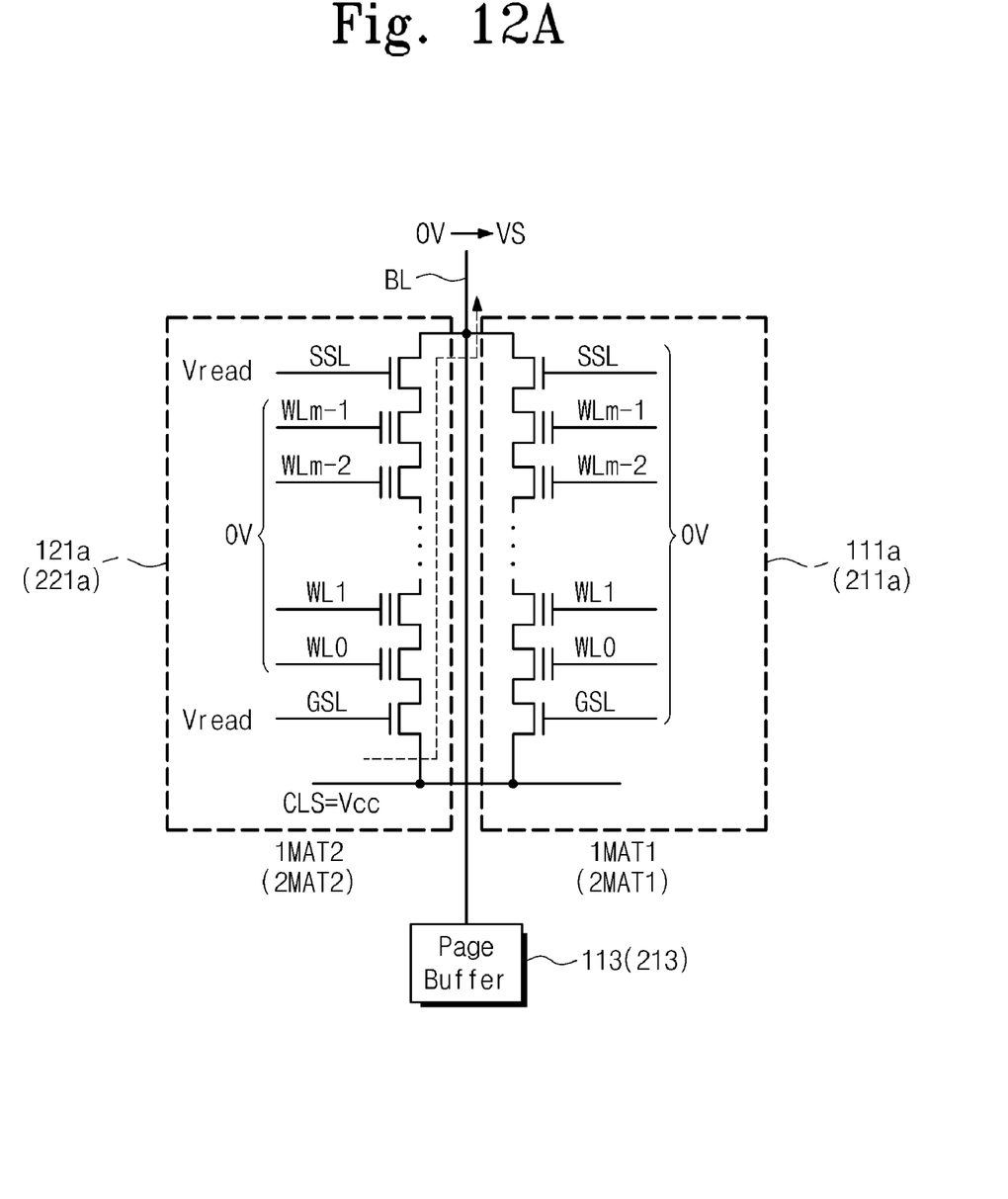
FIG. 12A shows a bias pattern of voltages applied to a block of the second layer by means source follower for erase verification.
Figure 12B:
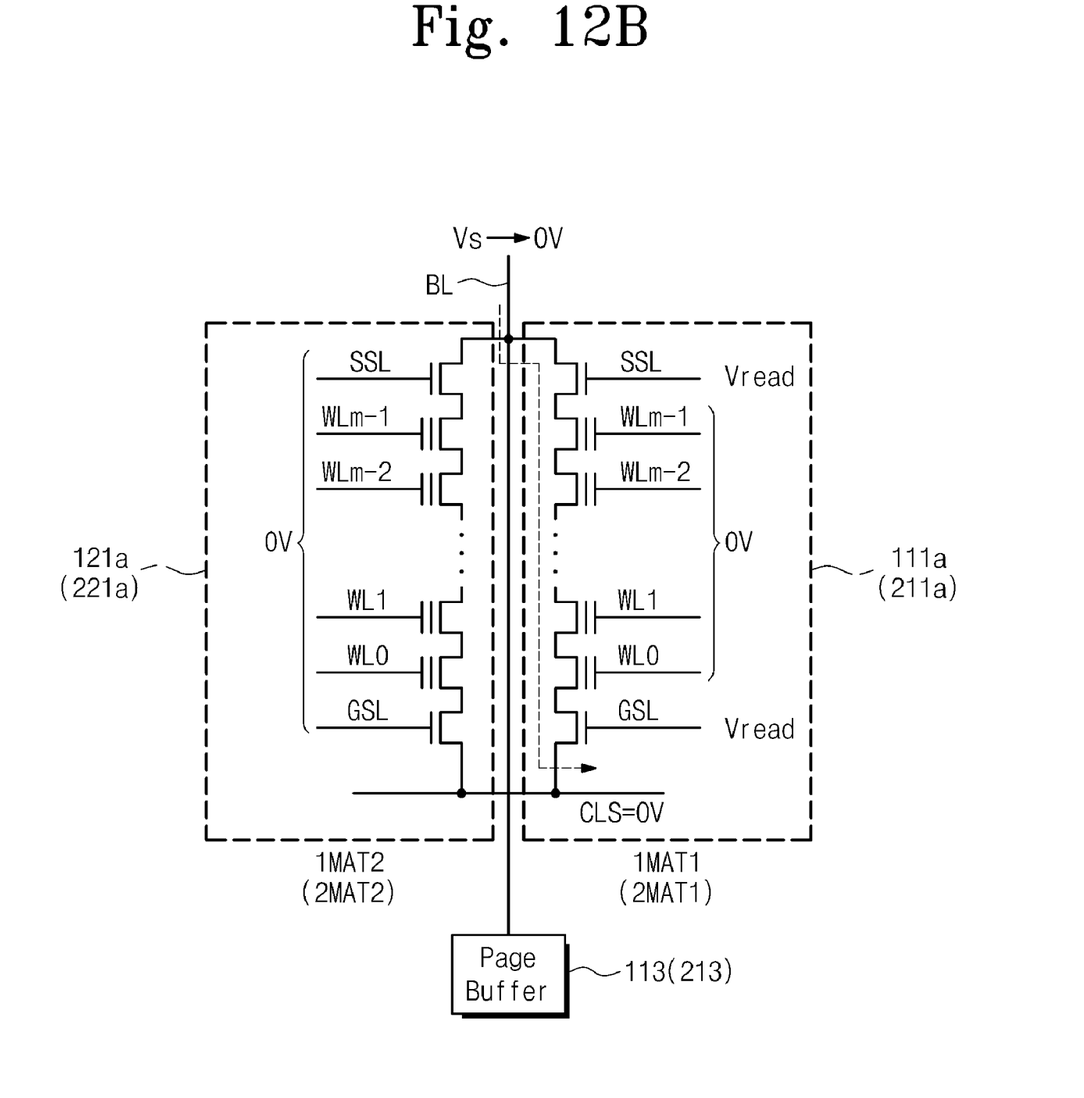
FIG. 12B shows a bias pattern of voltages applied to a block of the first layer during the erase-verifying mode by discharging a charged bit line.

FIGS. 12A and 12B further illustrate additional features associated with an erase operation verification following a block erase operation applied to a 3D memory device according to an embodiment of the invention. Referring to FIGS. 12A and 12B, one block is erase-verified by charging a bit line through source follower and then the other block is erase-verified by discharging the bit line. Here, the two bit lines are actually a shared bit line.

FIG. 12A shows a bias pattern of voltages applied to a block of the second layer by means source follower for erase verification. Referring to FIG. 12A, the 3D memory device according to an embodiment of the invention comprises two NAND strings 111a and 121a connected to a single bit line BL. The NAND strings 111a and 121a are all included in the first plane PLN1. The first NAND string 111a is formed on the first layer and the second NAND string 121a is formed on the second layer.

Referring to FIG. 12A, the erase operation for the second NAND string 121a may be conducted as follows. An erase voltage is applied to memory cells of the second NAND string 121a. After erasing the memory cells of the second NAND string 121a, a channel is generated through the second NAND string 121a. The erase verification is carried out after a predetermined time since the erase voltage has been applied to the memory cells of the second NAND string 121a. The erase verification is complete by determining whether the bit line BL is charged to a voltage of the common source line CSL through the channel.

During this determination process, the power voltage Vcc is applied to the common source line CSL. For connecting the channel to the bit line BL and the common source line CSL, a read voltage Vread is applied to corresponding string and ground selection lines SSL and GSL of second NAND string 121a, and 0V is applied to the word lines WL0 through WLm-1. 0V is also applied to the string and ground selection lines, and the word lines of the first NAND string 111a.

Completing the erase operation for the second NAND string 121a, the channel is formed through the second NAND string 121a. Then, the bit line BL is charged up to the power voltage Vcc of the common source line VSL through the channel. That is, if the memory cells of the second NAND string 121a have been completely erased, the bit line BL is charged up to a predetermined voltage Vs. The page buffer 113 senses a voltage from the bit line BL, determining whether the erase operation has been successfully conducted. Thereby, the erase verification for the second NAND string 121a is completed.

FIG. 12B shows a bias pattern of voltages applied to a block of the first layer during an erase verification conducted by discharging a charged bit line. Referring to FIG. 12B, the erase operation for the first NAND string 111a may be conducted as follows. An erase voltage is applied to memory cells of the first NAND string 111a. After erasing the memory cells of the first NAND string 111a, a channel is generated through the first NAND string 111a. The erase verification is carried out after a predetermined time since the erase voltage has been applied to the memory cells of the first NAND string 111a. The erase verification is complete by determining whether the bit line BL is charged to a voltage of the common source line CSL through the channel.

During this determination process, 0V is applied to the common source line CSL. For connecting the channel to the bit line BL and the common source line CSL, a read voltage Vread is applied to string and ground selection lines SSL and GSL of the first NAND string 111a. 0V is also applied to the word lines WL0~WLm-1. In the meantime, 0V is applied to the string and ground selection lines, and the word lines of the second NAND string 121a.

Completing the erase operation associated with the first NAND string 111a, the channel is formed through the first NAND string 111a. Then, the bit line BL is discharged to 0V through the channel. That is, if the memory cells of the first NAND string 111a have been completely erased, the bit line BL is discharged to 0V from the voltage Vs. The page buffer 113 senses a voltage from the bit line BL, determining whether the erase operation has been successfully conducted. Thereby, the erase verification for the first NAND string 111a is completed.

In the 3D multi-plane memory device according to an embodiment of the invention, erase operations may be sequentially performed for the various layers by charging and discharging a shared bit line. Such erase operations may thus be performed with reduced power consumption.

Figure 13:
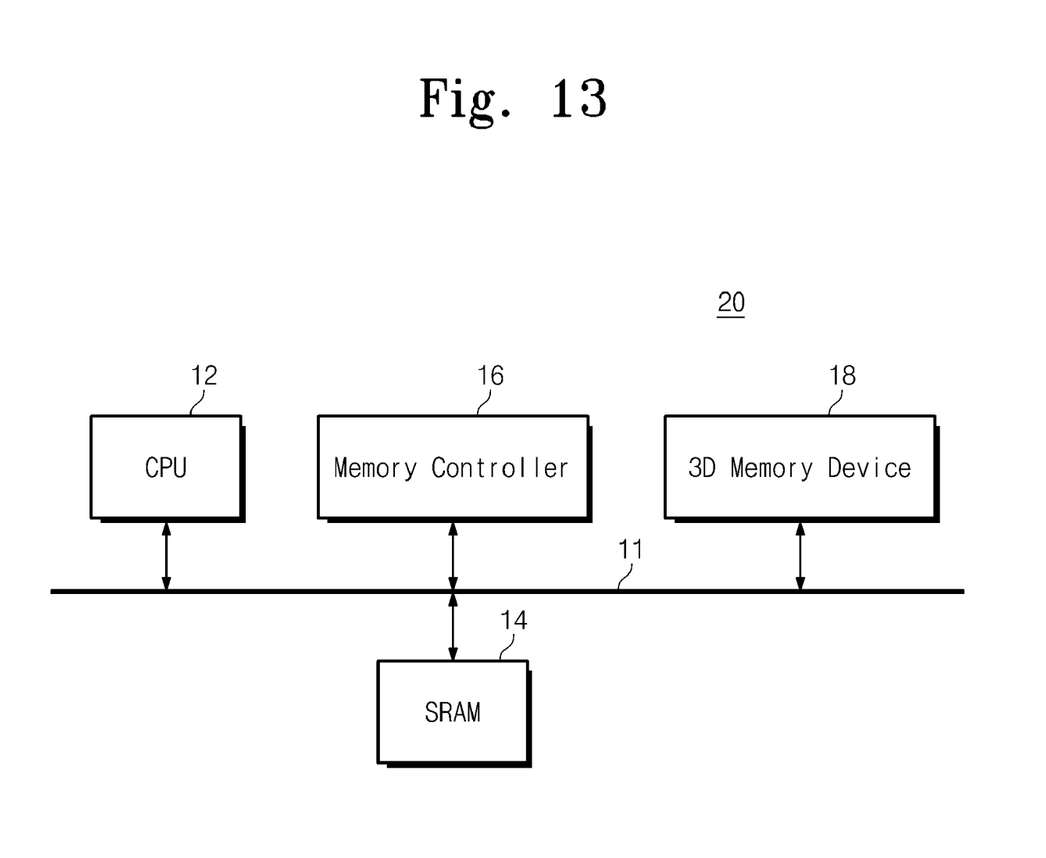
FIG. 13 is a block diagram of a memory system including a 3D multi-plane memory device according to an embodiment of the invention.

FIG. 13 is a block diagram of a memory system 20 including a 3D multi-plane memory device according to an embodiment of the invention. Referring to FIG. 13, the memory system 20 comprises; a central processing unit (CPU) 12, a static RAM (SRAM) 14, a memory controller 16, and a 3D memory device 18, all of which are connected to each other by way of a bus 11. The 3D memory device 18 shown in FIG. 13 may be configured substantially as same as that shown in FIG. 1. In the 3D memory device 18, N-bit data (where N is an integer greater than 0) processed or to be processed by the CPU 12 are stored through the memory controller 16.

Although not shown in FIG. 13, the memory system 10 may be further equipped with an application chipset, a camera image processor (e.g., complementary metal-oxide-semiconductor (CMOS) image sensor; i.e., CIS), a mobile DRAM, etc. For instance, the memory controller 16 and the 3D memory device 18 may form a nonvolatile solid state drive/disk (SSD).

The 3D memory and/or the memory controller can be mounted on the memory system by means of various types of packages. For instance, the 3D memory and/or memory controller according to the present invention may be placed on the memory system by any package type, e.g., Package-on-Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip-On-Board (COB), CERamic Dual In-line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), Thin Quad Flat Pack (TQFP), System In Package (SIP), Multi-Chip Package (MCP), Wafer-level Fabricated Package (WFP), Wafer-level Processed Stack Package (WSP), or Wafer-level Processed Package (WSP).

The above-disclosed subject matter is to be considered illustrative, and not restrictive, and the appended claims are intended to cover all such modifications, enhancements, and other embodiments, which fall within the scope of the present invention. Thus, to the maximum extent allowed by law, the scope of the present invention is to be determined by the broadest permissible interpretation of the following claims and their equivalents.

What is claimed is:

1. A 3D memory device comprising:
a first plane including a first mat formed on a first layer and a third mat formed on a second layer disposed over the first layer, the first and third mats sharing a bit line;
a second plane including a second mat formed on the first layer and a fourth mat formed on the second layer, the second and fourth mats sharing a bit line,
wherein each one of the first through fourth mats comprises a plurality of blocks, wherein a block associated with the first plane is simultaneously accessed with a block of the second plane; and
a memory controller that erase verifies the memory device so that blocks associated with the second and fourth mats are erase-verified in accordance with a determination of whether a shared bit line is charged, and blocks associated with the first and third mats are erase-verified in accordance with a determination that the shared bit line is discharged.

2. The 3D memory device of claim 1, wherein block addresses are sequentially allocated to select a block of the first mat, select a block of the second mat, select a block of the third mat, and then select a block of the fourth mat.

3. The 3D memory device of claim 2, wherein at least a page associated with the block of the first mat is simultaneously programmed with at least a page associated with the block of the second mat.

4. The 3D memory device of claim 2, wherein the block of the first mat is simultaneously erased with the block of the second mat.

5. The 3D memory device of claim 2, wherein the block of the first mat, the block of the second mat, the block of the third mat, and the block of the fourth mat are simultaneously erased.

6. The 3D memory device of claim 1, wherein block addresses are sequentially allocated to select a block of the first mat, select a block of the fourth mat, select a block of the second mat, and then select a block of the third mat.

7. The 3D memory device of claim 6, wherein at least a page associated with the block of the first mat is simultaneously programmed with at least a page associated with the block of the fourth mat.

8. The 3D memory device of claim 7, wherein the block of the first mat is simultaneously erased with the block of the fourth mat.

9. The 3D memory device of claim 7, wherein the block of the first mat, the block of the second mat, the block of the third mat, and the block of the fourth mat are simultaneously erased.

10. The 3D memory device of claim 1, wherein block addresses are continuously allocated to the planes of the first and second layers, but discontinuously allocated to the first and second layers.

11. The 3D memory device of claim 1, wherein block addresses are continuously allocated to the first and second layers, but discontinuously allocated to the planes of the first and second layers.

12. The 3D memory device of claim 1, wherein during a programming operation, a block address for the first plane is different from a block address for the second plane.

13. The 3D memory device of claim 1, wherein during an erase operation, a block address for the first plane is different from a block address for the second plane.

14. A 3D memory device comprising:
a bit line;
first and second NAND strings connected to the bit line; and
a page buffer configured to perform an erase-verification operation in relation to the first NAND string by determining whether the bit line is charged following an erase operation applied to the first NAND string, and further configured to perform the erase-verification operation in relation to the second NAND string by determining whether the bit line is discharged following an erase operation applied to the second NAND string.

15. The 3D memory device of claim 14, wherein the first and second NAND strings share a common source line, a power voltage is applied to the common source line during the erase operation applied to the first NAND string, and the bit line is charged to the power voltage through a channel formed by successfully erased memory cells of the first NAND string.

16. The 3D memory device of claim 14, wherein the first and second NAND strings share a common source line, a ground voltage is applied to the common source line during the erase operation applied to the second NAND string and the charged bit line is discharged to the common source line through a channel formed by successfully erased memory cells of the second NAND string.

* * * * *